United States Patent [19]

Cuppen

[11] Patent Number: 5,666,056
[45] Date of Patent: Sep. 9, 1997

[54] MAGNETIC RESONANCE IMAGING APPARATUS

[75] Inventor: Johannes J. M. Cuppen, Eindhoven, Netherlands

[73] Assignee: U.S. Philips Corporation, New York, N.Y.

[21] Appl. No.: 670,038

[22] Filed: Jun. 25, 1996

Related U.S. Application Data

[63] Continuation of Ser. No. 284,967, Aug. 2, 1994, abandoned.

[30] Foreign Application Priority Data

Aug. 2, 1993 [EP] European Pat. Off. ............ 93202277

[51] Int. Cl.$^6$ ............................................. G01R 33/25
[52] U.S. Cl. ........................................... 324/318; 324/319
[58] Field of Search .................................... 324/318, 319, 324/320, 322; 335/296–300; 128/653.5

[56] References Cited

U.S. PATENT DOCUMENTS

| | | | |
|---|---|---|---|
| 4,534,358 | 8/1985 | Young | 324/318 |
| 4,985,678 | 1/1991 | Gangarosa et al. | 324/318 |
| 5,008,624 | 4/1991 | Yoshida | 324/318 |
| 5,042,487 | 8/1991 | Marquardt | 128/653.5 |
| 5,378,988 | 1/1995 | Pulyer | 324/319 |
| 5,517,121 | 5/1996 | Kaufman et al. | 324/320 |

FOREIGN PATENT DOCUMENTS

| | | |
|---|---|---|
| 0067933 | 12/1982 | European Pat. Off. |
| 0314262 | 5/1989 | European Pat. Off. |
| 0517452 | 12/1992 | European Pat. Off. |
| 3909276 | 10/1989 | Germany . |

*Primary Examiner*—Sandra L. O'Shea
*Assistant Examiner*—Raymond Y. Mah
*Attorney, Agent, or Firm*—Jack D. Slobod

[57] ABSTRACT

A magnetic resonance imaging apparatus includes a main magnet having a frame (19) with two magnetic elements (1) arranged thereon. The magnetic elements (1) have substantially parallel faces (3) that face each other so as to define a gap (5) between the magnetic elements. The magnetic elements (1) have magnetic poles of opposite polarities for generating a static magnetic field in the gap (5). A patient support (45) is provided for supporting a patient (47) so that a part of the patient that is to be examined is located in the gap (5). In order to improve the accessibility of the patient (47) without increasing the width of the gap (5), a supporting member (37) is arranged so as to support the frame (19) in such a position that the normals (41) to the planes of the substantially parallel faces (3) of the magnetic elements (1) extend in a direction that encloses an angle between 30° and 60° with the vertical direction.

4 Claims, 3 Drawing Sheets

MAGNETIC RESONANCE IMAGING APPARATUS

This is a continuation of application Ser. No. 08/284,967, filed Aug. 2, 1994, (now abandoned).

BACKGROUND OF THE INVENTION

1. Field of the Invention

The invention relates to a magnetic resonance imaging apparatus including a main magnet having a frame with two magnetic elements having substantially parallel faces that face each other so as to define a gap between the magnetic elements, said magnetic elements comprising magnetic poles of opposite polarities for generating a static magnetic field in the gap, a supporting member for supporting said frame in a predetermined position relative to a substantially horizontal floor, and a patient support for supporting a patient so that a part of the patient that is to be examined is located in the gap.

2. Description of the Related Art

An example of an apparatus of this kind is disclosed in U.S. Pat. No. 5,008,624. In this known apparatus the faces that define the gap extend in the vertical direction. During an examination, the patient sits on a chair with a portion of his body located between the faces. A major advantage of this arrangement is that the magnet structure is open. This allows an easy access to the patient and causes less claustrophobia than conventionally designed magnets. In order to enable the examination of various parts of the patient's body, the magnet can be rotated about an axis that is parallel to the line connecting the faces and the chair can be lifted and tilted so as to support the patient at arbitrary angles with respect to the floor. It is a disadvantage of the known apparatus that the gap must be wide enough to accommodate the widest part of a patient. In other words, the gap must be at least as wide as the shoulder width of an adult person. However, it is very difficult and expensive to build a magnet having, in combination, a wide gap and a very homogeneous magnetic field with a high magnetic field strength in the gap.

SUMMARY OF THE INVENTION

It is an object of the invention to provide an apparatus of the kind set forth in which substantially every part of a patient can be examined without the gap being excessively wide. At the same time, the patient should be at least as accessible as in the known apparatus and claustrophobia should be prevented. To achieve these objects, the apparatus according to the invention is characterized in that the supporting member is arranged so as to support the frame in such a position that the normals to the planes of the substantially parallel faces of the magnetic elements extend in a direction that encloses an angle between 30° and 60° with the vertical direction. The faces defining the gap are now tilted which makes it easy to move the patient or a part of the patient sideways into the gap which may be narrower than the shoulder width of the patient.

A preferred embodiment of the apparatus according to the invention, with which virtually every part of the patient's body can be examined, is characterized in that the patient supporting means is arranged for supporting a patient in a lying position, the longitudinal direction of the patient extending substantially at right angles to a vertical plane defined by one of the normals to the planes of the faces of the magnetic elements (i.e. the longitudinal axis of the patient is substantially horizontal). A further embodiment, which is particularly suitable for examining the lower extremities of a patient, is characterized in that the patient supporting means is arranged for supporting the patient in a sitting position with a predetermined lower body part of the patient located in the gap.

A further embodiment is characterized in that the frame is substantially C-shaped comprising two limbs connected via a connecting beam, each one of said limbs having a free end with one of the magnetic elements arranged thereon, the frame being made of a magnetically conductive material, a magnetic field generating means being arranged so as to generate a magnetic field in the connecting beam, each one of the magnetic elements comprising a pole shoe. In this embodiment the magnetic field generating means can comprise a coil wound of copper wire or a superconductive magnet that surrounds the connecting beam which then acts as a magnetic yoke. It may also comprise a permanent magnet that forms part of the connecting beam.

It is also possible that each one of the magnetic elements comprises a magnetic field generating means. The magnetic field generating means may comprise e.g. superconductor blocks as described in U.S. Pat. No. 5,008,624 or a pair of Helmholz coils. These and other aspects of the invention will be apparent from the embodiments described hereinafter.

DETAILED DESCRIPTION OF THE PREFERRED EMBODIMENTS

Figure 1:
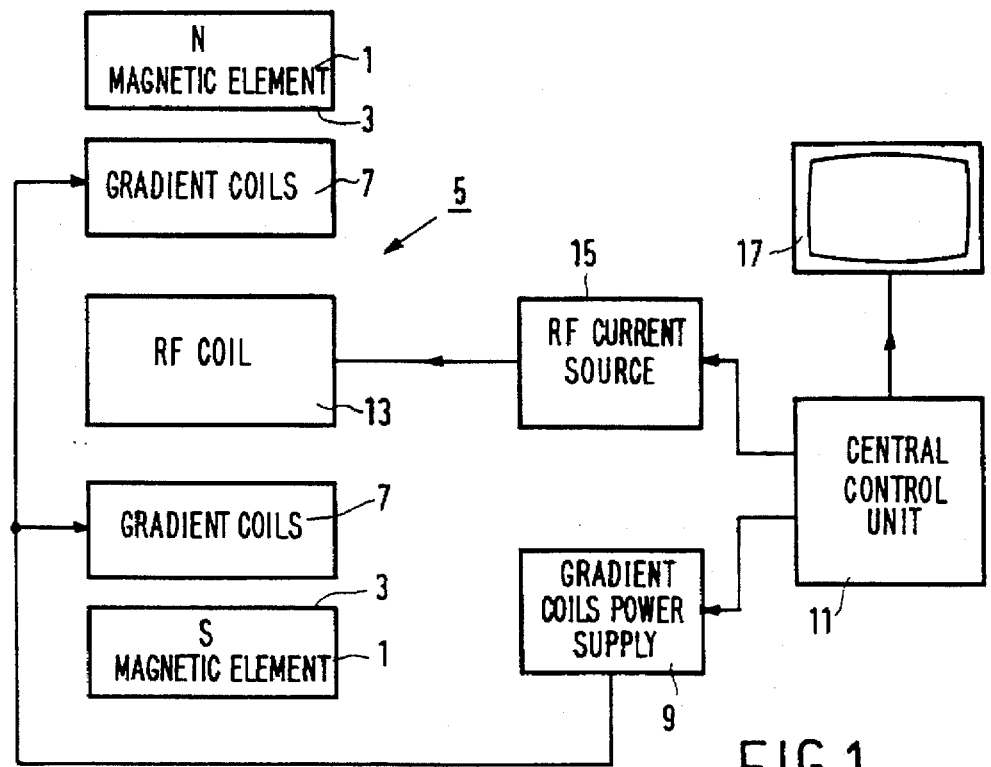
FIG. 1 is a block diagram for a magnetic resonance imaging apparatus.

FIG. 1 shows a block diagram of a magnetic resonance imaging (MRI) apparatus comprising a main magnet with two magnetic elements 1 having substantially parallel faces 3 that face each other so that a gap 5 is defined between them. One of the magnetic elements 1 comprises a magnetic north pole (indicated with the letter N) and the other one comprises a magnetic south pole (indicated with the letter S). Together, the magnetic elements 1 generate a static, substantially homogeneous magnetic field in the gap 5. Gradient coils 7 are provided in the gap 5 to generate magnetic gradient fields. The gradient coils 7 are connected to a power supply 9 that is controlled by a central control unit 11. A radio frequency coil (RF coil) 13 is also provided in the gap 5. The RF coil 13 serves to generate a magnetic RF field and for that purpose it is connected to a source of RF current 15 that is also controlled by the central control unit 11. The RF coil 13 may also serve to detect magnetic resonance signals generated by the RF transmitter field in an object to be examined. In that case the block 15 also comprises signal amplifier means. It is also feasible to provide a separate RF receiver coil connected to signal amplifier means (not shown). The central control unit 11 also controls a monitor 17 for display of an image acquired by magnetic resonance imaging of the object to be examined.

Figure 2:
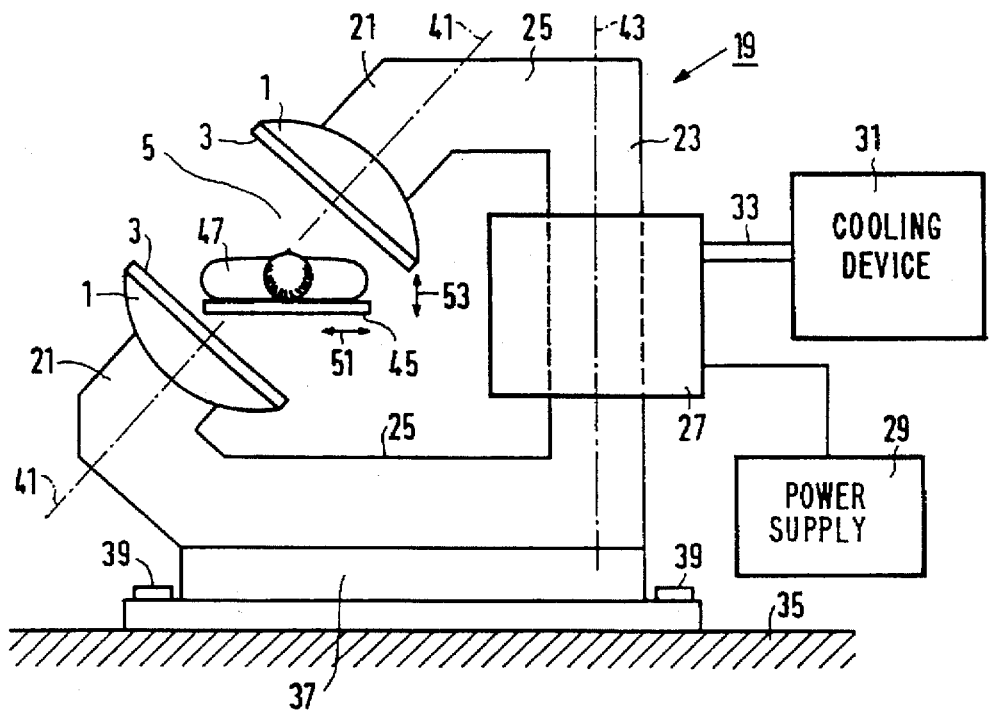
FIG. 2 is a schematic side view of a first embodiment of the main magnet of a magnetic resonance imaging apparatus according to the invention.

FIG. 2 schematically shows an embodiment of the main magnet that is a part of the MRI apparatus shown in FIG. 1. The magnet comprises a substantially C-shaped frame 19 having two limbs 21 that are connected via a connecting beam 23. In this embodiment intermediate beams 25 are provided between the limbs 21 and the connecting beam 23. A magnetic element is provided at the free end of each limb 21. The frame 19 is made of a magnetically conductive material such as iron or a suitable ferrite material. A magnetic field generating means comprises a coil 27 that is arranged around the connecting beam 23 and receives electric current from a power supply 29. For cooling, if necessary, there is provided a cooling device 31 which comprises cooling ducts 33. A cooling device of this kind may be constructed as a water cooling system for a resistive coil 27 (for example a copper coil) or as a liquid nitrogen or helium dewar system for a superconducting coil. The magnetic elements 1 are also made of magnetically conductive material. They are formed as pole shoes that guide the magnetic lines of force to the gap 5 so as to provide a very homogeneous magnetic field in the gap.

The frame 19 is fixed to a substantially horizontal floor 35 by means of a supporting member 37 that comprises bolts 39. The normals to the planes of the faces 3 are shown at 41. The connecting beam 23 has a longitudinal axis 43. In this embodiment, the normal 41 to the plane of the face 3 of the magnetic element 1 coincides with the longitudinal axis of the limb 21 to which the magnetic element is attached. The supporting member 37 is arranged so that the frame 19 is fixed to the floor 35 in such a position that the longitudinal direction of the connecting beam 23 is substantially vertical and that the normals 41 to the planes of the faces 3 of the magnetic elements 1 extend in a direction that encloses an angle between 30° and 60° (preferably close to 45°) with the vertical direction. In other words, in the embodiment shown in FIG. 2 the (coinciding) normals 41 define a vertical plane and enclose an angle between 30° and 60° with the vertical direction which is the direction of the longitudinal axis 43 of the connecting beam 23. As a result, the accessibility of the gap 5 from the side (in the horizontal direction) is almost as good as the accessibility of a horizontal gap would be whereas the available space in the vertical direction within the gap substantially exceeds that of a horizontal gap. When a patient supporting means 45 is arranged for supporting a patient 47 so that he lies on his back in the gap 5, the face 3 of the uppermost magnetic element 1 is at some distance above his head 49 as shown in FIG. 2. Consequently, there is considerably less risk of claustrophobia than in a conventional arrangement with a horizontal gap. Moreover, it is comparatively easy for an operator to handle the patient and to communicate with the patient 47 while he is positioned within the gap 5.

Figure 3:
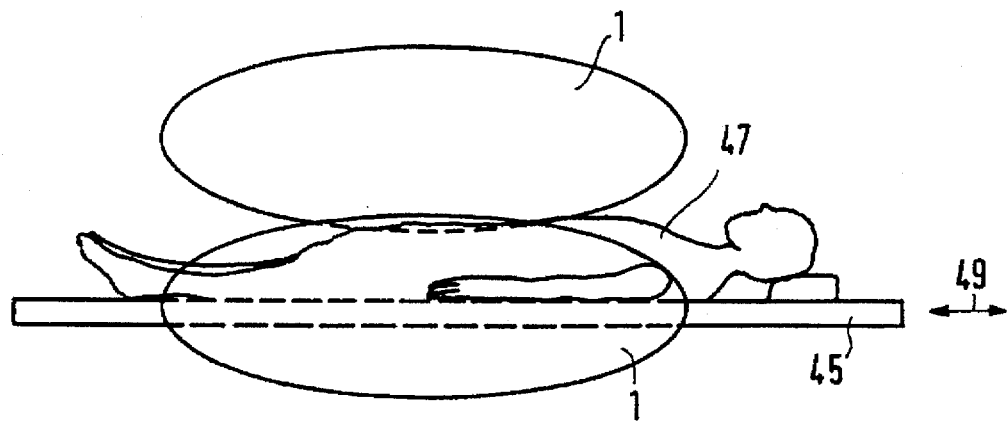
FIG. 3 is a front view of the embodiment shown in FIG. 2.

In the embodiment shown in FIG. 2, the patient supporting means 45 is a patient table on which the patient can be positioned so that his longitudinal direction extends substantially at right angles to a vertical plane defined by one of the normals 41 to the planes of the faces 3 of the magnetic elements 1. In the embodiment shown in FIG. 2, these normals coincide so that they both lie in the said vertical plane that is parallel to the plane of the drawing. If the normals do not coincide, only one of them lies in the said vertical plane. FIG. 3 shows a view from the left side in FIG. 2 (a front view). In FIG. 3 only the magnetic elements 1, the patient table 45 and the patient 47 are shown. The patient table 45 can be moved horizontally and vertically by some well-known means (not shown) as indicated by the arrows 49, 51 and 53 in FIGS. 2 and 3. The patient 47 can thus be positioned so that any predetermined part of his body is in the most homogeneous part of the magnetic field in the gap 5. This part of the patient's body can then be examined with the apparatus.

Figure 4:
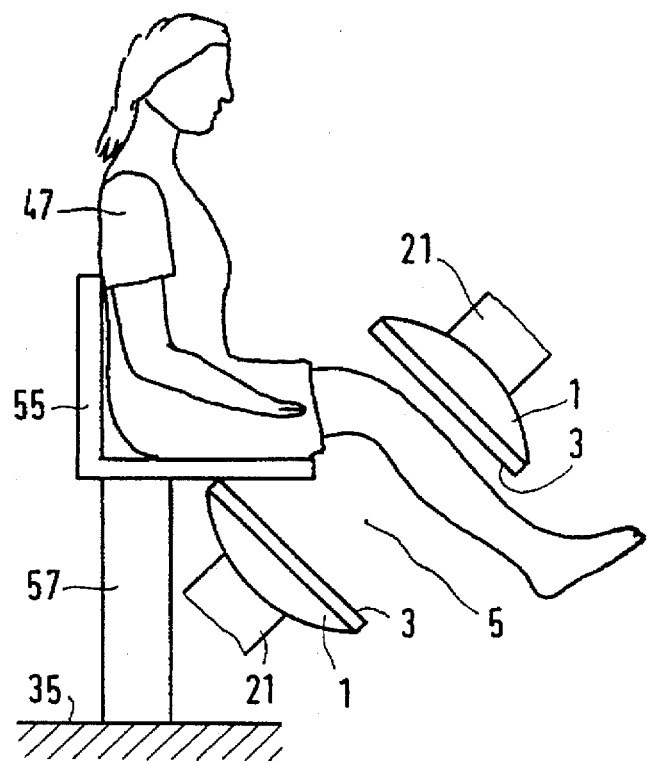
FIG. 4 is side view of a second embodiment of the main magnet of a magnetic resonance apparatus according to the invention.

FIG. 4 shows an embodiment of the apparatus that is particularly suitable for the examination of the lower parts of a patient's body. In this embodiment the construction of the main magnet (partly shown) is substantially the same as in the first embodiment but the patient supporting means comprises a chair 55 that supports the patient 47 in a sitting position with a lower part of his body (for example his knees) located in the gap 5. The chair 55 is mounted on the floor 35 by means of a support structure 57 that may comprise mechanisms for lifting and/or reclining the patient. Such mechanisms are well known in the art, see for example U.S. Pat. No. 5,008,624. Therefore, no details are shown in the figure.

Figure 5:
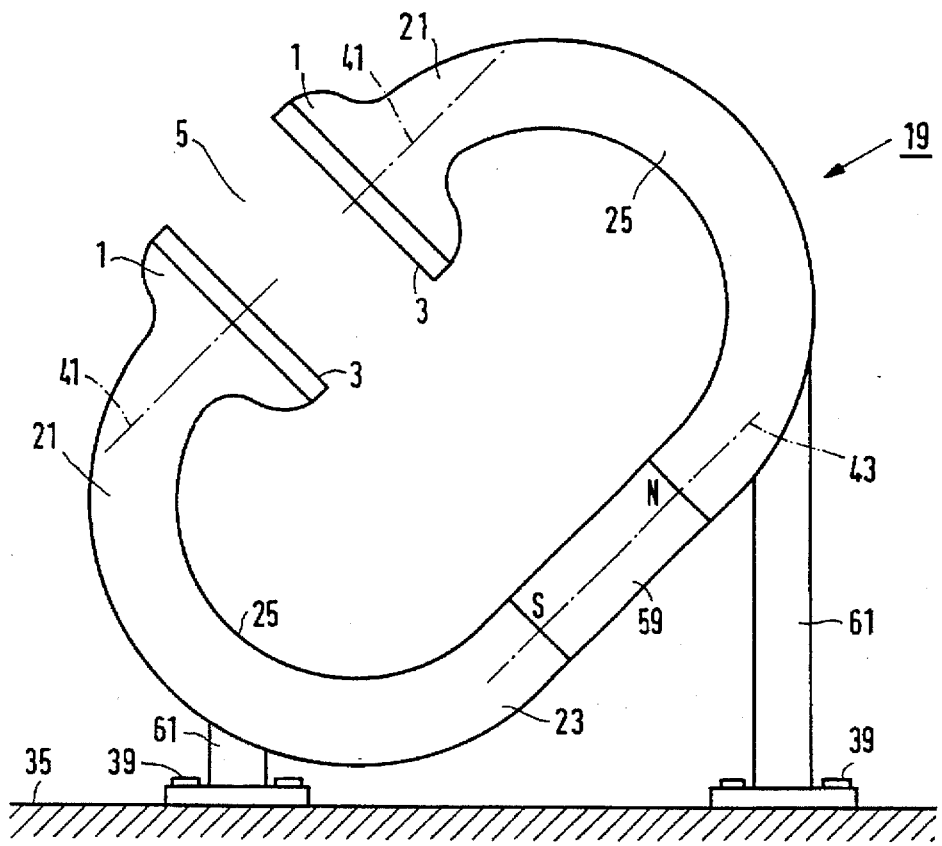
FIGS. 5 and 6 are side views of two further embodiments of the main magnet of a magnetic resonance apparatus according to the invention.

FIG. 5 shows another embodiment of the construction of the main magnet. In this embodiment, the intermediate beams 25 of the C-shaped frame 19 are substantially semicircular, the two limbs 21 being relatively short. The connecting beam 23 comprises a permanent magnet 59 with a north pole N and a south pole S as indicated. The limbs 21, the intermediate beams 25 and the parts of the connecting beam 23 that are adjacent to the permanent magnet 59 are made of magnetically conductive material just as the magnetic elements 1 that are shaped as pole shoes. The magnetic lines of force emanating from the permanent magnet 59 are guided by the adjacent parts of the connecting beam 23, the intermediate beams 25, the limbs 21 and the magnetic elements 1 to the gap 5. The frame 19 is fixed to the floor 35 by supporting means that comprise two pillars 61 of unequal length that are attached to the floor by means of bolts 39.

Figure 6:
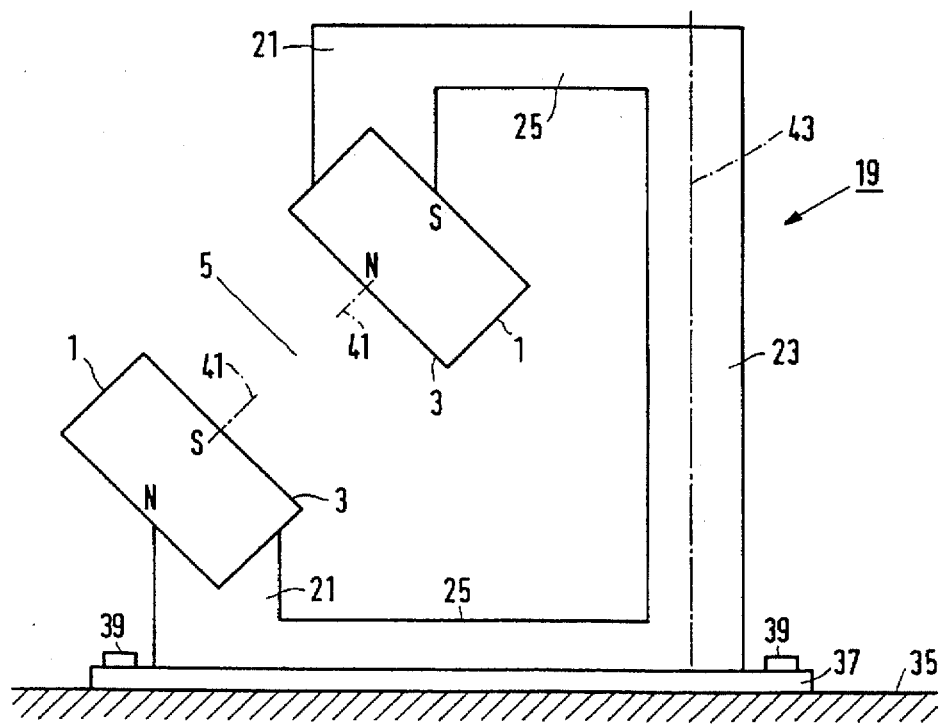

FIG. 6 shows still another embodiment of the construction of the main magnet. In this embodiment, the C-shaped frame 19 comprising the limbs 21, the intermediate beams 25 and the connecting beam 23 may be made of a material that is not magnetically conductive, for example stainless steel. The magnetic elements 1 comprise magnetic field generating means such as superconductor blocks as described in U.S. Pat. No. 5,008,624, said blocks having magnetic polarities as indicated in the figure. The magnetic field generating means can also comprise, for example, a pair of permanent magnets or a pair of Helmholm coils. The frame 19 is fixed to the floor 35 by a supporting member 37 that is similar to the supporting member used in the embodiment shown in FIG. 2.

In the embodiments described so far, the frame of the main magnet is substantially C-shaped. Other shapes are, however, also feasible, for example, a frame comprising a plurality of substantially vertical cylindrical columns as disclosed in EP-A-0 314 262.

I claim:

1. A magnetic resonance imaging apparatus including a main magnet comprising a frame connected between two magnetic elements having substantially parallel faces that face each other so as to define a gap between the magnetic elements, said magnetic elements comprising magnetic poles of opposite polarities for generating a static magnetic field in the gap, a supporting member for supporting said frame in a predetermined position relative to a substantially horizontal floor, and patient supporting means for supporting a patient so that a part of the patient that is to be examined is located in the gap, wherein the supporting member is arranged so as to support the frame in such a position that the normals to the planes of the substantially parallel faces of the magnetic elements extend in a direction that encloses an angle between 30° and 60° with the vertical direction, and wherein with the frame supported in said position the patient supporting means is arranged for supporting a patient in a lying position such that the longitudinal direction of the patient is substantially horizontal.

2. An apparatus as claimed in claim 1, wherein the frame is substantially C-shaped comprising two limbs connected via a connecting beam, each one of said limbs having a free end with one of the magnetic elements arranged thereon, the frame being made of a magnetically conductive material, a magnetic field generating means being arranged so as to generate a magnetic field in the connecting beam, each one of the magnetic elements comprising a pole shoe.

3. An apparatus as claimed in claim 1, wherein each one of the magnetic elements comprises a magnetic field generating means.

4. An apparatus as claimed in claim 2 wherein each one of the magnetic elements comprises a magnetic field generating means.

* * * * *